United States Patent [19]
Hamilton et al.

[11] Patent Number: 5,656,851
[45] Date of Patent: Aug. 12, 1997

[54] SEMICONDUCTOR WAFER HAVING SLICES AND LIMITED SCRIBE AREAS FOR IMPLEMENTING DIE

[75] Inventors: Brian D. Hamilton, Redwood City; Joseph R. Pierret, San Jose, both of Calif.

[73] Assignee: Elantec Semiconductor, Inc., Milpitas, Calif.

[21] Appl. No.: 443,623

[22] Filed: May 18, 1995

[51] Int. Cl.$^6$ .................................................. H01L 23/544
[52] U.S. Cl. .......................... 257/620; 257/786; 257/536; 257/202
[58] Field of Search .................................. 257/620, 202, 257/786, 532, 536, 758

[56] References Cited

U.S. PATENT DOCUMENTS 5,016,080  5/1991  Gianella .................................. 257/620

OTHER PUBLICATIONS

"The Flexar Delta Series Overview," EXAR Corporation, Dec. 1988, 8 pages.
"Preliminary Data Sheet May 1992" *Best-1 Series High Performance ECL Gate Arrays*, AT&T Microelectronics.

*Primary Examiner*—Mark V. Prenty
*Attorney, Agent, or Firm*—Fliesler, Dubb, Meyer & Lovejoy LLP

[57] ABSTRACT

A semiconductor wafer in an intermediate stage of fabrication having an array of slices. All but one of the slices may have integrated circuit components interconnected by metallization layers to form a die having an operable circuit, with the remaining slice functioning as a scribe area or line. Two embodiments of slices are disclosed in which one slice is a rectangle of a minimum width to function as a scribe area, and the other slice is composed of a sliver and a rectangle with the latter also having a minimum width to function as a scribe area. Each embodiment of a slice can be extended lengthwise with an extension box that also can function to contain operative components or function as a scribe area.

26 Claims, 5 Drawing Sheets

SEMICONDUCTOR WAFER HAVING SLICES AND LIMITED SCRIBE AREAS FOR IMPLEMENTING DIE

FIELD OF THE INVENTION

The present invention relates to the manufacture of semiconductor chips and, more particularly, to the fabrication of a wafer having die from which the semiconductor chips are assembled and packaged.

BACKGROUND ART

The manufacture of semiconductor chips essentially includes the three basic steps of wafer fabrication, die assembly, and die packaging. In the phase of wafer fabrication, a blank semiconductor wafer is made followed by integrating dice, having circuit components, on the wafer using well-known processing techniques of masking, diffusion and/or implantation, and wafer stepping. In the assembly phase, the die on the wafer are tested and marked for good and bad die, with the wafer then being sawed along scribe lines to provide individual die. Then, in the packaging phase, the good die are packaged, making them available for use as integrated circuit chips that may be placed on printed circuit boards to be interconnected with other packaged chips and thereby provide an overall electronic system.

The semiconductor industry is always seeking to reduce the cost of manufacture of its chips. Wafer fabrication and, in particular, the efficient use of the wafer "real estate" or silicon is a relatively high component of the cost factor for producing chips. The more die that can be produced on a wafer of a given size the less wasted silicon there will be, thereby making efficient utilization of the wafer and reducing chip component costs.

Typically, silicon may be wasted for several reasons. For example, common industry practice is to utilize a relatively large single array defined by a mask or mask set that may be stepped across the wafer using a wafer stepper, with scribe areas interposed between adjacent arrays. A given circuit composed of active and passive components may be implemented on the silicon within a single large array or across two or more adjacent arrays, depending on the number and size of the components. With such a relatively large array, if the circuit design is small, it may occupy only, for example, 20% of the array area, resulting in 80% of the die having wasted silicon. Alternatively, if a given circuit design requires just one more component than can be implemented in the single array, then the adjacent array must be utilized for this one component, resulting also in significant wasted silicon for the die comprised of the two adjacent arrays.

Inefficient use of silicon also results from the requirement for scribe areas. Common industry practice also is to have each array separated from one another by a scribe area. When more than one array is required for the fabrication of a die, the scribe areas between the adjacent die become wasted silicon.

Another problem which is related to the inefficient use of silicon is the fact that since disparate circuits occupying different sized areas are designed for semiconductor chips, many manufacturers have libraries of arrays varying from quite small to very large. Silicon efficiency would be improved by using the smallest array for a given circuit design. But this means that a range of arrays must be inventoried by the manufacturer, and circuit designers must work hard to eliminate that one extra component which could cause the circuit to extend onto an adjacent array.

U.S. Pat. No. 5,016,080 issued May 14, 1991, and entitled "Programmable Die Size Continuous Array", discloses a technique for more efficiently using the silicon of a wafer. As set forth in the '080 patent, among other features, a semiconductor wafer is fabricated in which either there are no scribe lines in either direction, i.e., horizontal and vertical, or preferably no scribe lines in at least one direction. Electrically isolated cells, which may be arranged in rows and columns, are provided throughout the wafer. Scribe lines may be arbitrarily placed according to an individual customized chip, with the isolated cells near the scribe lines being covered with metallization to form a bonding pad. By arranging the isolated cells in rows and columns, no matter where the scribe line is placed only one or two rows or columns of cells will be sawed. Since there are no scribe lines in at least one direction, the circuit designer can specify exactly the die size needed, which avoids wasting silicon as in the prior art.

One problem with the die size continuous array disclosed in the '080 patent is that it does not effectively provide for vertical stacking of the cells constituting the array. Also, the '080 patent does not make provision for extending the length of a given cell, and is not completely symmetrical in the peripheral cells forming an array.

SUMMARY OF THE INVENTION

The present invention provides for an array of slices on a wafer which more efficiently utilizes silicon, with each slice constituting a building block upon which to implement operable circuitry.

At an intermediate stage of fabrication, the semiconductor wafer will have an array of contiguous slices each of a predetermined width and length, pairs of bonding pads integrated on the wafer within at least one of these slices in a fixed predetermined position, groups of integrated circuit components in which one of the groups is integrated within one of the slices and between the one pair of bonding pads, and interconnect or metallization layers integrated on the wafer for interconnecting the integrated circuit components to form operable circuitry. At least one of the slices is without the bonding pads and the interconnect layers, and is adjacent to one of the slices having the operable circuitry to function as the scribe line.

In one specific embodiment, the contiguous slices in the array are arranged in a pattern comprised of identical slices of the same width and the same length. In an alternative embodiment, each of the contiguous slices in the array comprise an A-type area or sliver and a B-type area or rectangle different from one another. The A-type and B-type areas will have the same length, but the B-type rectangle has a greater width than the A-type sliver of the slice. The B-type rectangle has a minimum width such that it can function as a scribe line.

In another aspect of the present invention, for either specific embodiment of the slice, an extension box is integrated at one end of each of the slices of an array to extend the length of the corresponding slice. The extension box can then include integrated circuit components or a bonding pad. Metallization layers my be applied to interconnect the extension box with other components in the slice forming the operable circuitry, or the extension box may be left without metallization so as to function as a scribe line with other extension boxes along a parallel row adjacent the array of slices.

BRIEF DESCRIPTION OF THE DRAWINGS

FIG. 4A is a diagrammatic view of an example of a horizontal array of slices each comprised of the slice of FIG. 2A.

FIGS. 4B-4C are diagrammatic views of examples of vertically aligned arrays using the slice and extension box of FIG. 3A.

DETAILED DESCRIPTION OF THE DRAWINGS

Figure 1:
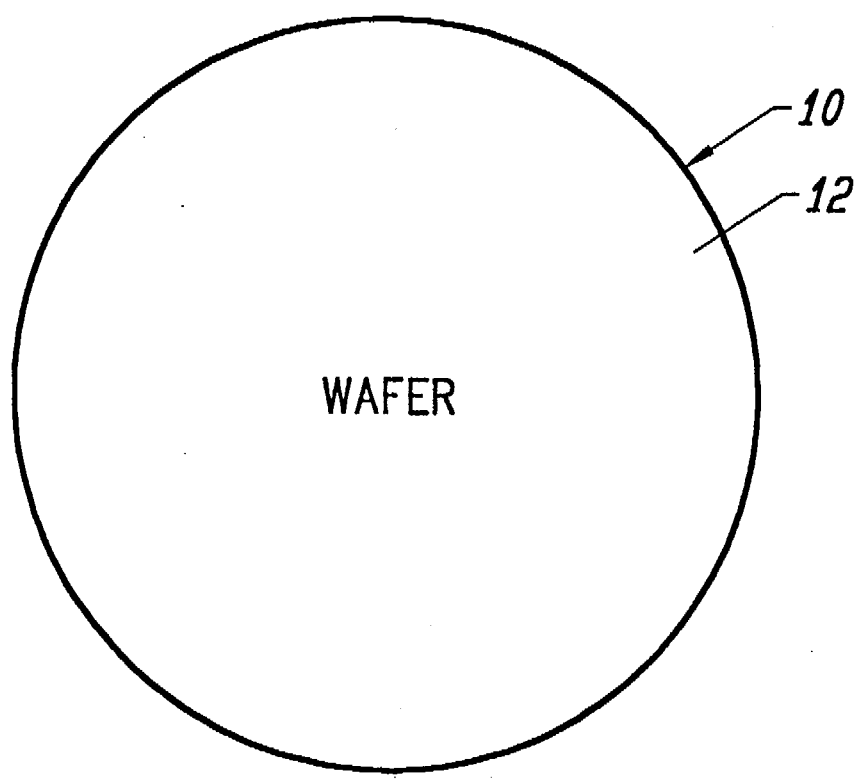
FIG. 1 illustrates a fabricated blank semiconductor wafer prior to implementing die on it.

FIG. 1 shows a semiconductor wafer 10 that is made of a semiconductor material 12 such as silicon. As illustrated, the wafer 10 has been fabricated and is in its blank form waiting further semiconductor processing for implementing integrated circuits on it.

Figure 2A:
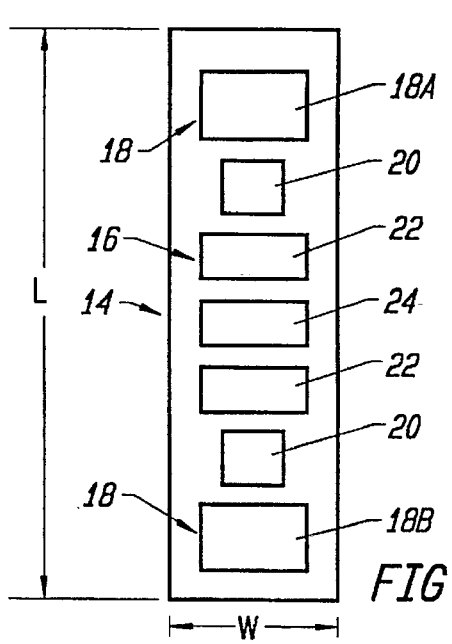
FIG. 2A is a diagrammatic illustration of one embodiment of a single slice of the present invention.

FIG. 2A shows a single slice 14 of a first embodiment of the present invention, which slice 14 constitutes a building block for an array of slices described below. The slice 14 is a rectangle that may contain a group 16 of circuit components, active and/or passive, together with bonding pads 18. The slice 14 has a width W of a maximum of approximately 7 mils and a length L of a maximum of approximately 35-36 mils. The group 16 of active and/or passive components within the slice 14 may include resistors 20, transistors 22, and capacitors 24. The pair of bonding pads 18, identified as pad 18A and pad 18B, are located at respective ends of and within the slice 14. The single slice 14 can function as operable circuitry if the design calls for adding metallization layers to the slice 14 to interconnect the components of group 16, or the slice 14 can function as a scribe area by not adding the metallization layers.

The slice 14 with its group 16 of active and/or passive components, and bonding pads 18, may form a single operable product once the metallization layer or layers are added to interconnect these components, so that a single slice 14 may comprise a die. Alternatively, the group 16 of components and bonding pads 18 of a single slice 14 may be a "building block" for a larger product such that an array of contiguous slices 14 may comprise the die for that product, as will be discussed below. The group 16 may be arranged in the order shown in FIG. 2A from top-to-bottom, with transistors 20 being, for example, NPN and PNP respectively for a bipolar product. This ordering is preferable for convenient connection of V+ and V− or ground via the bonding pads 18 once the corresponding die is assembled and packaged into a product.

Figure 2B:
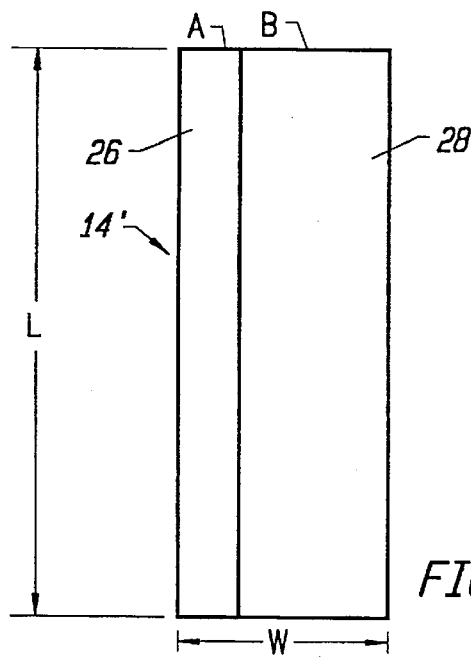
FIG. 2B is a diagrammatic view of an alternative embodiment of a single slice of the present invention.

FIG. 2B illustrates an alternative embodiment of a slice 14' that also is a building block. In this embodiment, the slice 14' comprises two areas A, B, with the A-area being a sliver 26 and the B-area being a rectangle 28. The rectangle 28 my contain the active components of a given circuit, particularly the transistors 22 (shown in FIG. 2A), while the sliver 26 may be used for the passive components such as the resistors 20 and capacitors 24 (shown in FIG. 2A). The slice has a width W of a maximum of approximately 8 mils and a length L of a maximum of approximately 35-36 mils. The width W of the slice 14' is divided such that the sliver 26 has a width of approximately 2 mils and the rectangle 28 of approximately 6 mils. The width of the rectangle 28 is a minimum which, in the same manner as with the embodiment of FIG. 2A, allows any given rectangle 28 to function as a scribe line, as will be further described. This embodiment of slice 14' allows the components in the sliver 26 to be usable in a die should the adjacent rectangle 28 be used as a scribe line during assembly.

Figure 3A:
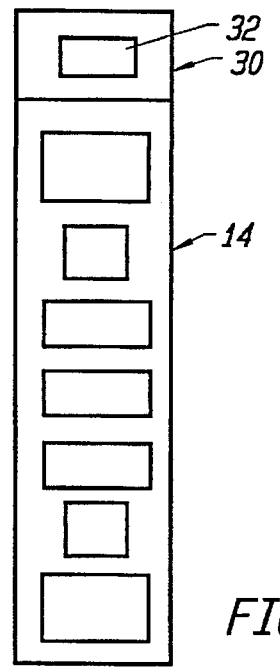
FIG. 3A illustrates the addition of an extension box at one end of the slice of FIG. 2A.

FIG. 3A illustrates the slice 14 of FIG. 2A extended by an extension box 30 at one end of the slice 14. The extension box 30 may include active/passive circuit components or a bonding pad as shown generally at 32. This extension box 30 can be used for transition circuitry between vertically adjacent slices 14 (see FIG. 4B or FIG. 4C described below) or as a scribe area during assembly. The box 30 has the same width W as the slice 14 and has a length of a maximum of approximately 7 mils by which the slice 14 is extended.

Figure 3B:
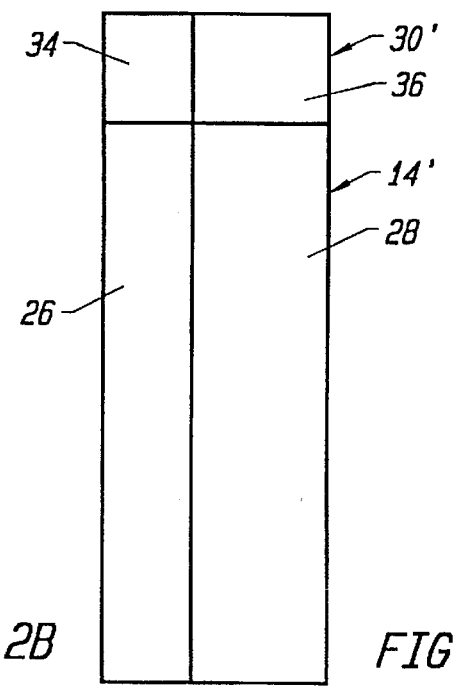
FIG. 3B illustrates the extension box at one end of the slice of FIG. 2B.

FIG. 3B is similar to FIG. 3A, but shows an extension box 30' for extending the slice 14' of FIG. 2B. The extension box 30' has a sliver 34 and a rectangle 36 for extending the slice 14'. The width of sliver 34 is the same width as the sliver 26, i.e. approximately 2 mils, while the rectangle 36 is the same width as rectangle 28, i.e. approximately 6 mils. The length of extension box 30' is a maximum of approximately 7 mils by which the slice 14' is extended.

Figures 4A, 4B, 4C:
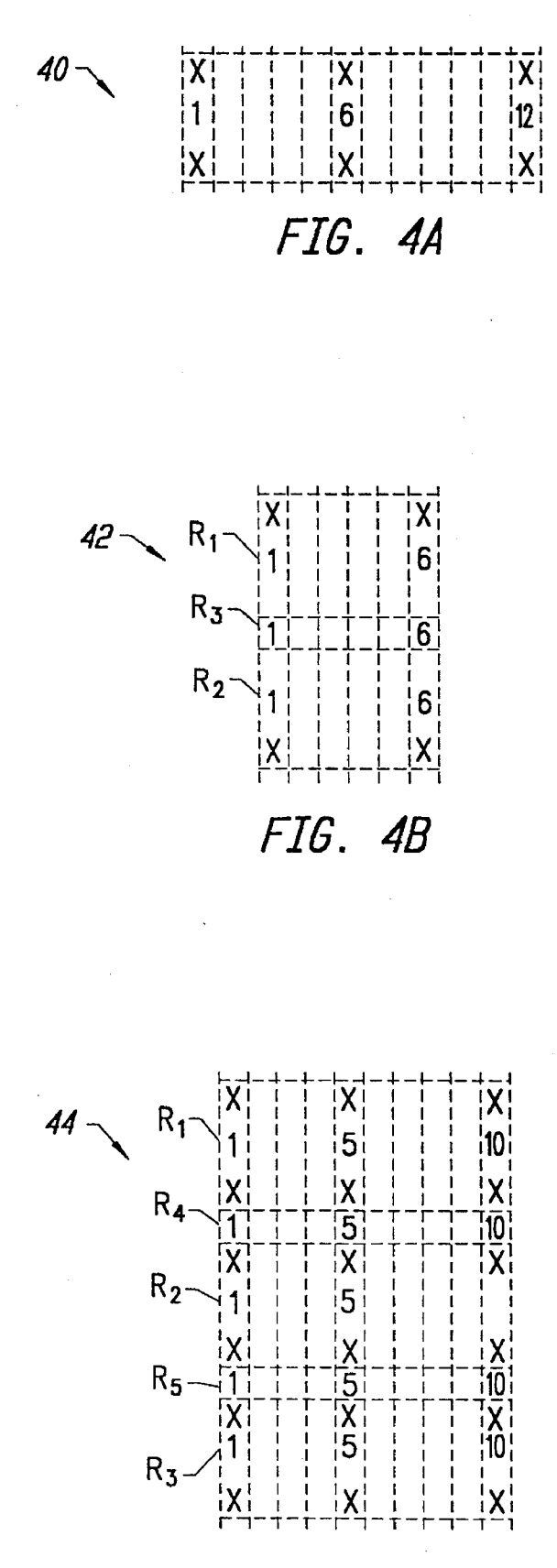

FIG. 4A illustrates an example of an array 40 of slices 14 that may be stepped as a unit across the wafer 10 during the wafer stepping process of wafer fabrication, in which the wafer stepper will have a mask or mask set corresponding to the pattern of array 40. FIG. 4A shows an array 40 having twelve slices in a row, each corresponding to the slice 14 of FIG. 2A. Eleven of the slices 14 in array 40 may each have implemented within it the groups 16 of circuit components and bonding pads 18 previously described, together with metallization layers to form an operable product such as, for example, an operational amplifier. The slice 14 on either end of the array 40 (Nos. 1 or 12 shown) will then function as the scribe area during assembly. In this FIG. 4A and other figures described below an "X" represents a bonding pad 18.

FIG. 4B shows another array 42 which is an example of a "double vertical" slice array that, also using a wafer stepper, can be stepped across the wafer 10 during wafer fabrication. In this example, the array 42 comprises an upper row $R_1$ of six adjacent slices 14 and a lower row $R_2$ of six adjacent slices 14 separated by a row $R_3$ of the extension boxes 30 each corresponding to the box shown in FIG. 3A. In this example, the slices 14 and boxes 30, will have the circuit components 16, bonding pads 18 and metallization layers, to form an operable product constituting a die, except for the vertically aligned slices and box at one end of the array 42 (Nos. 1 or 6). The slices and box at the one end will have the circuit components and bonding pads, but no metallization so as to function as a vertical scribe area or line during die assembly.

FIG. 4C is an example of a "triple vertical" slice array 44, constituting three vertically aligned rows $R_1$, $R_2$, and $R_3$ of ten slices 14 each separated by rows $R_4$, $R_5$ of respective extension boxes 30 as shown. As with the array 42, the slices and boxes at one end of array 44 comprise the vertical scribe line or area with the remainder of array 44 being a die that is assembled during the assembly phase.

Figure 5A:
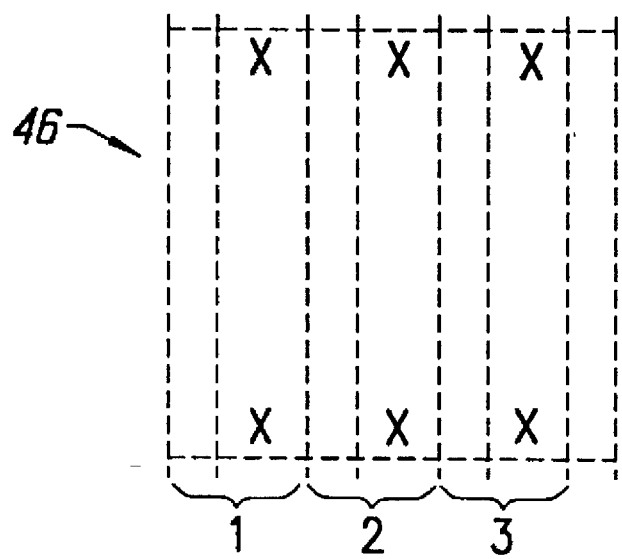
FIG. 5A is a view of an example of a horizontal array of slices comprised of the slice of FIG. 2B.

FIG. 5A illustrates an example of an array 46 of slices 14'. This array 46 constitutes a die having three slices 14'

Figure 5B:
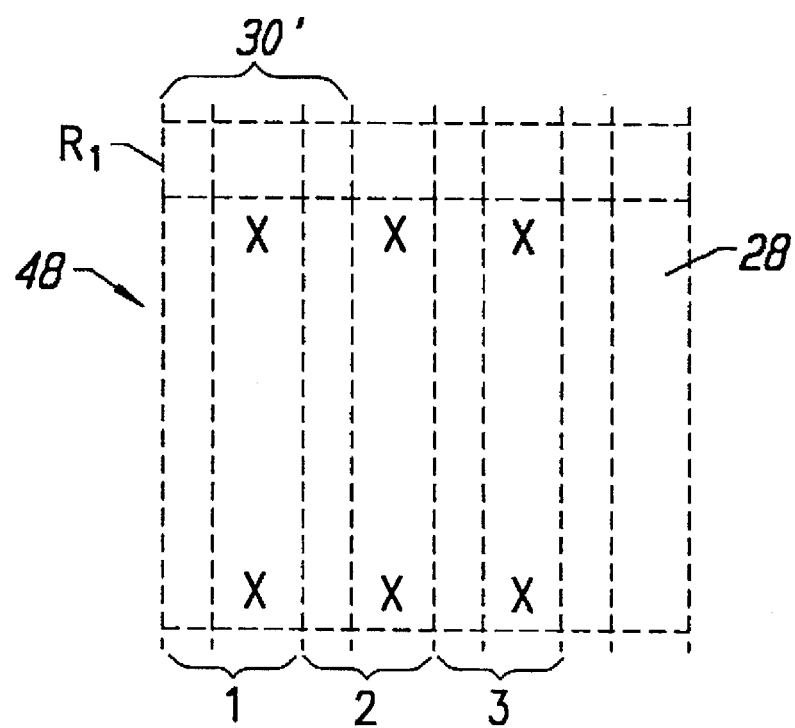
FIG. 5B is a diagrammatic view of an example of a horizontal array of slices comprised of the slice of FIG. 3B.

(numbered 1–3) plus an additional sliver that will contain passive components such as resistors and capacitors for an operable product as previously described. FIG. 5B is similar to FIG. 5A, except it shows an array 48 having a horizontal scribe area comprised of a row $R_1$ of the extension boxes 30' and a vertical scribe area comprising the rectangle 28.

As shown in FIG. 5A, the array 46 is symmetric from left-to-right. This symmetry is advantageous for making certain products, for example a dual amplifier. An original design of a single amplifier can be implemented within the array 46 shown in FIG. 5A, and then mirrored within another array 46 (not shown) adjacent to the array 46 Of FIG. 5A. It also is possible simply to place a second amplifier adjacent to the original in this other array (not shown) without taking advantage of the symmetry, but "pin-out" standards for an IC packaged chip may dictate using the mirrored amplifier.

The above-described arrays have been disclosed as having a number of slices, depending on the size of the product being manufactured. Furthermore, as already indicated, the wafer fabrication phase of semiconductor chip manufacture includes wafer stepping in which a wafer stepper will step a given array pattern across the wafer. It is preferable to provide an array that has an integer multiple of slices constituting a die. Thus, for example, an array of 72 slices 14 or 14' would be an integer multiple of dice having respectively, 3, 4, 6, 8, or 12 slices including one slice 14 or 14' that would function as a scribe area as previously disclosed. This multiple-integer array then can be efficiently stepped across the wafer 20 by a wafer stepper having a mask or mask set for this array pattern.

As an alternative, the semiconductor industry uses "e-beam" technology to create the necessary masks used to implement die on the wafer. With the present invention, if e-beam technology were used during mask fabrication, then the multiple-integer array mask set for the wafer stepper would be replaced by an e-beam mask set which would cover the complete wafer. This mask set would allow chip sizes incorporating any integer number of slices rather than only allowing sub-multiples of the array mask set used for wafer steppers.

Figure 6:
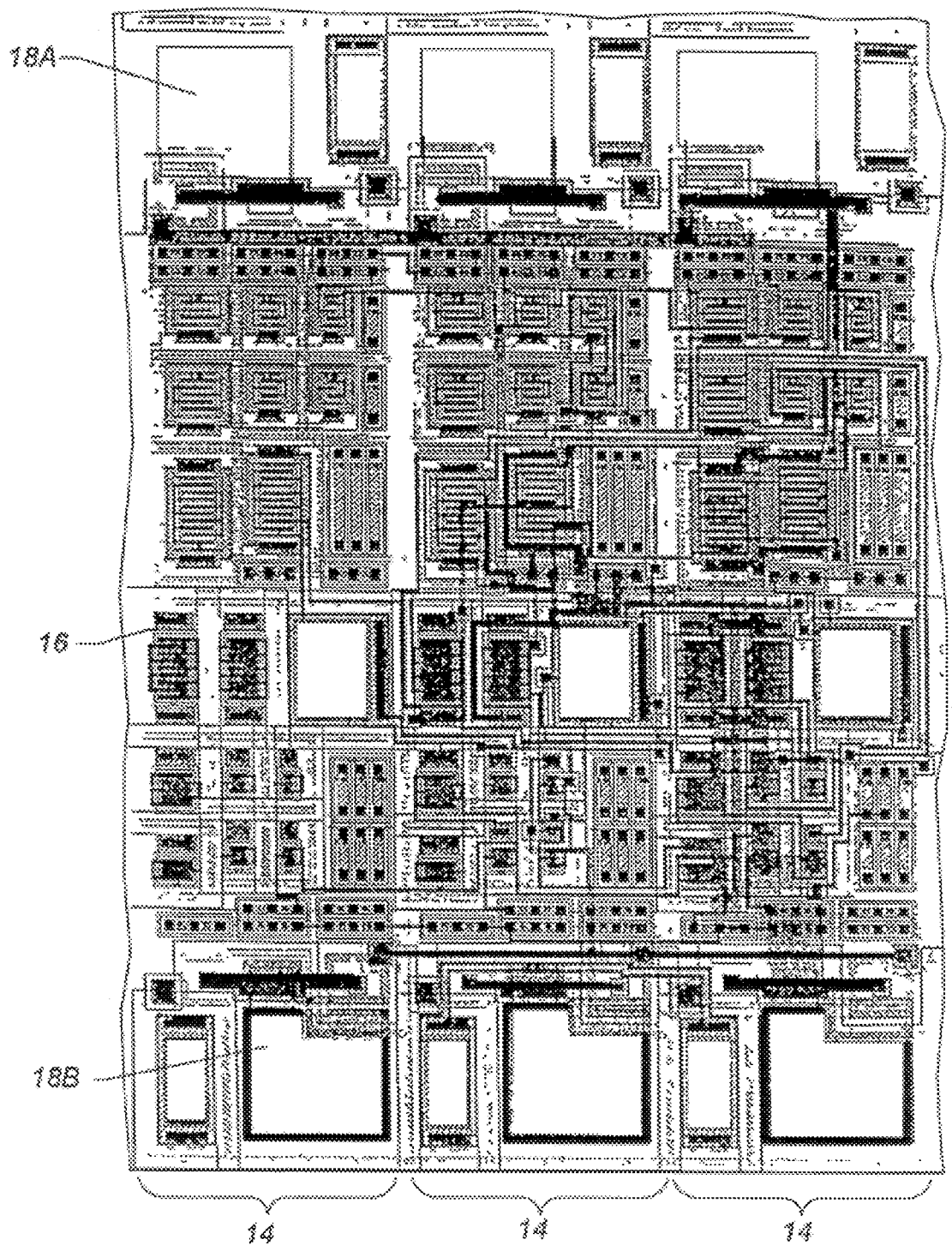
FIG. 6 is a photo copy of a plot of an actual die showing an exemplary array of slices.

FIG. 6 is a photocopy of a plot of an actual die that was assembled from a wafer and that illustrates slices 14 of the present invention. There is shown 3 contiguous slices 14, each having bonding pads 18, groups 16 of circuitry and metallization layers for interconnecting this circuitry into an operative product.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

We claim:

1. A semiconductor wafer at an intermediate stage of manufacture and from which integrated circuit chips may be assembled, comprising:
    a) a row of contiguous slices, each of said slices having a predetermined width and length;
    b) pairs of bonding pads, one of said pairs being integrated on the wafer within one of said slices, in a fixed, predetermined position;
    c) groups of integrated circuit components, one of said groups being integrated on the wafer within one of said slices, respectively, and between said one pair of bonding pads; and
    d) interconnect layers integrated on the wafer for interconnecting said integrated circuit components to form operable circuitry, in which at least one of said slices is without said bonding pads and said interconnect layers and adjacent to one of said slices having said operable circuitry to function as a scribe line.

2. A semiconductor wafer, according to claim 1, wherein said contiguous slices in said row are arranged in an array comprised of identical slices of the same width and the same length.

3. A semiconductor wafer, according to claim 2, wherein each of said identical slices is approximately 7-mils wide.

4. A semiconductor wafer, according to claim 3, wherein each of said identical slices is a maximum of approximately 35–36 mils long.

5. A semiconductor wafer, according to claim 1, wherein said contiguous slices in said row are arranged in an array in which each of said slices has an A-type sliver and B-type rectangle being different from one another, wherein said A-type sliver of each of said slices has the same respective width and the same respective length, said B-type rectangle the same respective width and the same length, and said A-type sliver and said B-type rectangle each has the same length.

6. A semiconductor wafer, according to claim 5, wherein said B-type rectangle has a width greater than said A-type sliver.

7. A semiconductor wafer, according to claim 5, wherein said B-type rectangle has a width sufficient to enable said B-type rectangle to function as a scribe line, and said A-type sliver has a width such that said A-type sliver does not function as a scribe line.

8. A semiconductor wafer, according to claim 7 wherein said B-type rectangle is approximately 6-mils wide and said A-type sliver is approximately 2-mils wide.

9. A semiconductor wafer, according to claim 8, wherein said A-type sliver and said B-type rectangle are each a maximum of approximately 35–36-mils long.

10. A semiconductor wafer, according to claim 1, further comprising an extension box integrated at one end of each of said slices of said row, respectively, to extend the length of said slices, respectively.

11. A semiconductor wafer, according to claim 10, wherein said extension box includes an integrated circuit component.

12. A semiconductor wafer, according to claim 10, wherein said extension box includes a bonding pad.

13. A semiconductor wafer, according to claim 10, wherein each said extension box is without said interconnect layers to function as a scribe line along a parallel row adjacent said row of slices.

14. A semiconductor wafer, according to claim 1, wherein said integrated components comprise capacitors adjacent at least one of said bonding pads.

15. A semiconductor wafer, according to claim 1, wherein said integrated circuit components comprise resistors/transistors adjacent at least one of said bonding pads.

16. A semiconductor wafer, according to claim 1, wherein said interconnect layers comprise 2-layer metallization.

17. A semiconductor wafer, according to claim 16, wherein said interconnect layers further comprise a third layer of interconnect.

18. A semiconductor wafer, according to claim 17, wherein said third layer may be either a metal layer or a polysilicon layer.

19. A semiconductor wafer, comprising:
   a) a rectangular slice having a predetermined width and length, said width of said slice being sufficient for said slice to function as a scribe line, said slice including
      i) fixed bonding pads at both ends of said rectangular slice; and
      ii) integrated circuit components positioned between said fixed bonding pads; and
   b) an extension box integrated at one of said ends of said rectangular slice, said extension box having a predetermined width and length, said width of extension box being the same as said width of said slice, said extension box having an integrated circuit component, and said length of said extension box being sufficient for said box to function as a scribe line.

20. A semiconductor wafer, according to claim 19, wherein said width and said length of said extension box are the same.

21. A semiconductor wafer, according to claim 20 wherein said slice is approximately 7-mils wide by a maximum of approximately 35–36-mils long, and said extension box is approximately 7-mils wide by 7-mils long.

22. A semiconductor wafer, comprising:
   a) a slice integrated on the wafer, said slice including
      i) an A-type sliver having a predetermined first width and first length, said first width being sufficiently narrow for said A-type slice to include integrated circuit components, but not function as a scribe line; and
      ii) a B-type rectangle adjacent said A-type sliver and having a predetermined second width and second length, said second width being sufficiently wide for said rectangle to include integrated circuit components and to function as a scribe line, said first length and said second length being the same;
   b) fixed bonding pads within either end of said B-type rectangle, respectively; and
   c) integrated circuit components positioned between said bonding pads and within said A-type sliver and said B-type rectangle.

23. A semiconductor wafer, according to claim 22, wherein said B-type rectangle is approximately 6-mils wide by a maximum of approximately 35–36-mils long, and said A-type sliver is approximately 2-mils wide by a maximum of approximately 35–36-mils long.

24. A semiconductor wafer, according to claim 22, further comprising:
   a) a first extension box at one end of said rectangle and having a predetermined third width and third length, said third width being the same as said second width; and
   b) a second extension box adjacent one end of said sliver and having a predetermined fourth width and fourth length, said fourth width being the same as said first width, said third length and said fourth length being the same and being sufficient for said first extension box and said second extension box to function as a scribe line.

25. A semiconductor wafer, comprising:
   a) an array of rows and columns of the same repeatable slices, each of said rows having a first number of contiguous repeatable slices, said columns having a second number of slices, each of said slices having a width sufficient to enable said slices to function as scribe lines, and wherein said first number of contiguous repeatable slices is an integer multiple of the number of die that may be formed from said array;
   b) pairs of fixed bonding pads positioned at ends of said slices, respectively and
   c) integrated circuit components integrated on the wafer between said pairs of fixed bonding pads.

26. A semiconductor wafer, according to claim 25, further comprising a plurality of extension boxes, each of said extension boxes being integrated on the wafer between two adjacent slices in a column of slices, respectively, and wherein said extension boxes have a length sufficient for said boxes to function as a scribe line.

* * * * *